United States Patent [19]
Lee

[11] Patent Number: 5,097,149
[45] Date of Patent: Mar. 17, 1992

[54] TWO STAGE PUSH-PULL OUTPUT BUFFER CIRCUIT WITH CONTROL LOGIC FEEDBACK FOR REDUCING CROSSING CURRENT, SWITCHING NOISE AND THE LIKE

[75] Inventor: Terry R. Lee, Boise, Id.

[73] Assignee: Micron Technology, Inc., Boise, Id.

[21] Appl. No.: 667,709

[22] Filed: Mar. 11, 1991

Related U.S. Application Data

[63] Continuation-in-part of Ser. No. 545,789, Jul. 23, 1990, Pat. No. 5,001,369.

[51] Int. Cl.$^5$ ............................................. H03K 17/16
[52] U.S. Cl. .................................. 307/443; 307/263; 307/473
[58] Field of Search ............... 307/443, 448, 451, 473, 307/263

[56] References Cited

U.S. PATENT DOCUMENTS

| | | | |
|---|---|---|---|
| 4,777,389 | 10/1988 | Wu et al. | 307/443 |
| 4,785,201 | 11/1988 | Martinez | 307/443 |
| 4,785,203 | 11/1988 | Nakamura | 307/448 |
| 4,789,796 | 12/1988 | Foss | 307/443 |
| 4,800,298 | 1/1989 | Yu et al. | 307/443 |
| 4,818,901 | 4/1989 | Young et al. | 307/443 X |
| 4,820,942 | 4/1989 | Chan | 307/473 X |
| 4,855,623 | 8/1989 | Flaherty | 307/451 X |
| 4,918,339 | 4/1990 | Shigeo et al. | 307/443 X |

*Primary Examiner*—David Hudspeth
*Attorney, Agent, or Firm*—Stanley N. Protigal

[57] ABSTRACT

A low noise output buffer circuit that activates and deactivates the output by means of a two stage NAND and FET circuit. The two stages turn on sequentially but turn off simultaneously and minimizes the peak power supply current that normally appears during input and output switching operations.

37 Claims, 3 Drawing Sheets

TWO STAGE PUSH-PULL OUTPUT BUFFER CIRCUIT WITH CONTROL LOGIC FEEDBACK FOR REDUCING CROSSING CURRENT, SWITCHING NOISE AND THE LIKE

CROSS-REFERENCE TO RELATED APPLICATION

This is a continuation-in-part to U.S. patent application Ser. No. 545,789 filed July 23, 1990, now U.S. Pat. No. 5,001,369.

BACKGROUND OF THE INVENTION

1. Field of the Invention

This invention relates to a low noise complimentary metal oxide semiconductor (CMOS) tri-state output buffer circuit that sequentially activates alternate CMOS devices to reduce peak power supply transients.

Many techniques have been employed to reduce the power and ground current spikes associated with output buffers switching in CMOS circuits. Output buffers are used in order to provide sufficient current drive to switch the large parasitic capacitances associated with both package and printed circuit board interconnects. Low noise outputs are particularly important in a video random access memory (VRAM) integrated circuit (IC), since there are as many as eight outputs switching simultaneously which are asynchronous to the dynamic random access memory (DRAM) timing i.e., serial data outputs (SDQs). Failures caused by power supply noise can occur when the SDQ outputs switch at critical periods in the DRAM timing.

SUMMARY OF THE INVENTION

The CMOS devices used in this circuit comprise eight field effect transistors (FET), a plurality of logic signal inverters, a pair of delay circuits, a plurality of NAND gates, and appropriate resistors. The FETs are arranged to comprise a two-stage driver circuit. The VRAMs described above that would most likely use this circuit would be used in graphic displays for computer work stations and personal computers. In this application, the VRAM would need seventeen of these circuits, one for a special function output, eight for serial access data outputs (SDQs) and eight more for the data outputs (DQs).

There are advantages of this invention over prior art since the output stage reduces power and ground noise caused by output switching. This improvement is important especially for a VRAM, since several outputs switch simultaneously i.e., (SDQs) which are asynchronous to the DRAM operation. Thus, failures associated with the SDQ outputs switching during critical periods of the DRAM timing should be reduced.

DETAILED DESCRIPTION OF THE INVENTION

Figure 1:
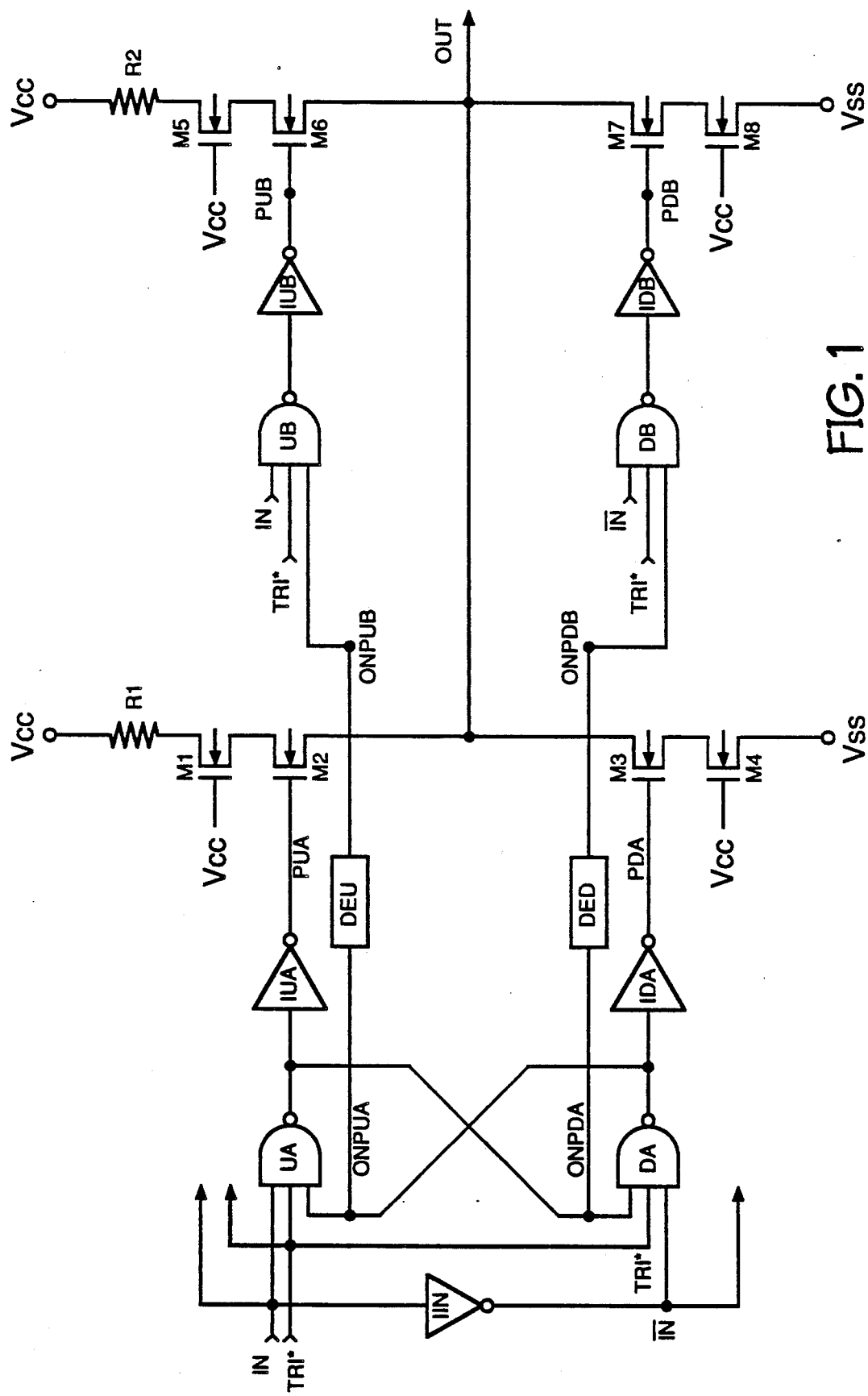
FIG. 1 is an electrical schematic of the present invention.

A description of the two-stage buffer circuit will be made by referring to FIG. 1. Pull-up logic gates UA and UB, pull-down logic gates DA and DB, pull-up inverters IUA and IUB, and pull-down inverters IDA and IDB are connected as shown to driver stages M1-M4 and M5-M8.

The device labels ending in "A" and M1 through M4 represent the first stage of the buffer circuit, while the devices ending in "B" and M5 through M8 represent the second stage. The logic gates associated with the control of the pull-up devices contain a "U", whereas the logic gates associated with the pull-down device control contain a "D".

The invention comprises two series output devices in lieu of a single device in order to reduce current injected into the substrate. FETs M1-M4 and M5-M8 comprise two output driver stages. Resistors R1 and R2 typically are used to limit the current from $V_{CC}$. Note, however, that adding a resistor(s) at $V_{SS}$ cannot be used to limit the ground current at $V_{SS}$ without sacrificing TTL $V_{OL}$ or (maximum allowable voltage in the low state).

Transistors M1, M4, M5, and M8 reduce source-to-drain voltage VDS across M2, M3, M6, and M7, reducing substrate injected current. Long transistor lengths are additionally used.

When switching the output to low, driver pull-up device M2 must be turned off prior to turning driver pull-down device M3 on to eliminate crossing current. If M2 and M3 were turned on simultaneously, a low impedance path would exist between $V_{CC}$ and $V_{SS}$, which would increase supply noise and could cause other internal circuits to fail. Through careful circuit design and device sizing, M2 can be guaranteed to be off prior to M3 turning on. In that regard, the delay through gate IUA should match the delay through gate IDA. The delay through gate DA should match the transition time of the signal PUA. Specifically, the delay from signal ONPDA going high to the output of DA transitioning low should equal the time for PUA to transition from a logic one to within a threshold voltage of $V_{SS}$. By choosing transistor device sizes with consideration of the parasitic capacitive loads, PUA can be guaranteed to be within a threshold voltage of $V_{SS}$ prior to PUB transitioning high.

In addition to sizing device driver-to-load ratios, the performance of the crossing current circuit can be adjusted by varying voltage trip points of gates UA, IUA, DA, and IDA. For example, if less crossing current is desired, the input trip point of gate DA can be set to be 3/5 of $V_{CC}$ instead of ½ of $V_{CC}$. In this manner, ONPDA must transition to a higher level before the output of DA will transition low, thus delaying the turn-on of M3. In this manner, the speed of the buffer circuit can be optimized as a function of allowable power supply noise.

The trip point of a gate can be adjusted by varying the relative device sizes of the p and n channel devices comprising the CMOS logic gate. Further, trip points of UA (DA) may be adjusted by varying only the p channel device size that signal ONPUA (ONPDA) drives. This adjustment can be accomplished with changes in only the metallization layer by using multiple parallel p channel devices for ONPUA (ONPDA) and connecting the correct number of devices with metal to obtain the desired trip point. With this approach, changes in the trip point for signals ONPUA (ONPDA) will not affect the trip points for signals IN, /IN, and TRI*.

The same principles apply to the second driver stage M5–M8, as M6 is ultimately controlled by ONPUA and M7 is ultimately controlled by ONPDA.

Figure 2:
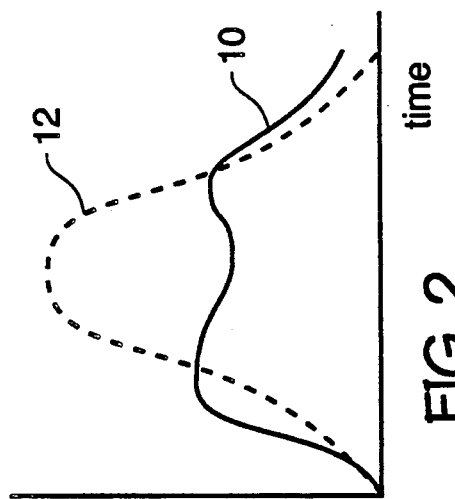
FIG. 2 is a plot of power supply current versus time during a switching cycle.

Referring to FIG. 2, it is a purpose of this invention to have the two stages of the output driver fired in sequence to reduce the maximum current spike 10 on $V_{CC}$ or ground ($V_{SS}$) as compared to the single output stage current spike at 12. The effect of a current transient is to cause an electrical transient voltage dip on the power supply at $V_{CC}$ which will disturb other internal voltages in the integrated circuit.

Figure 3:
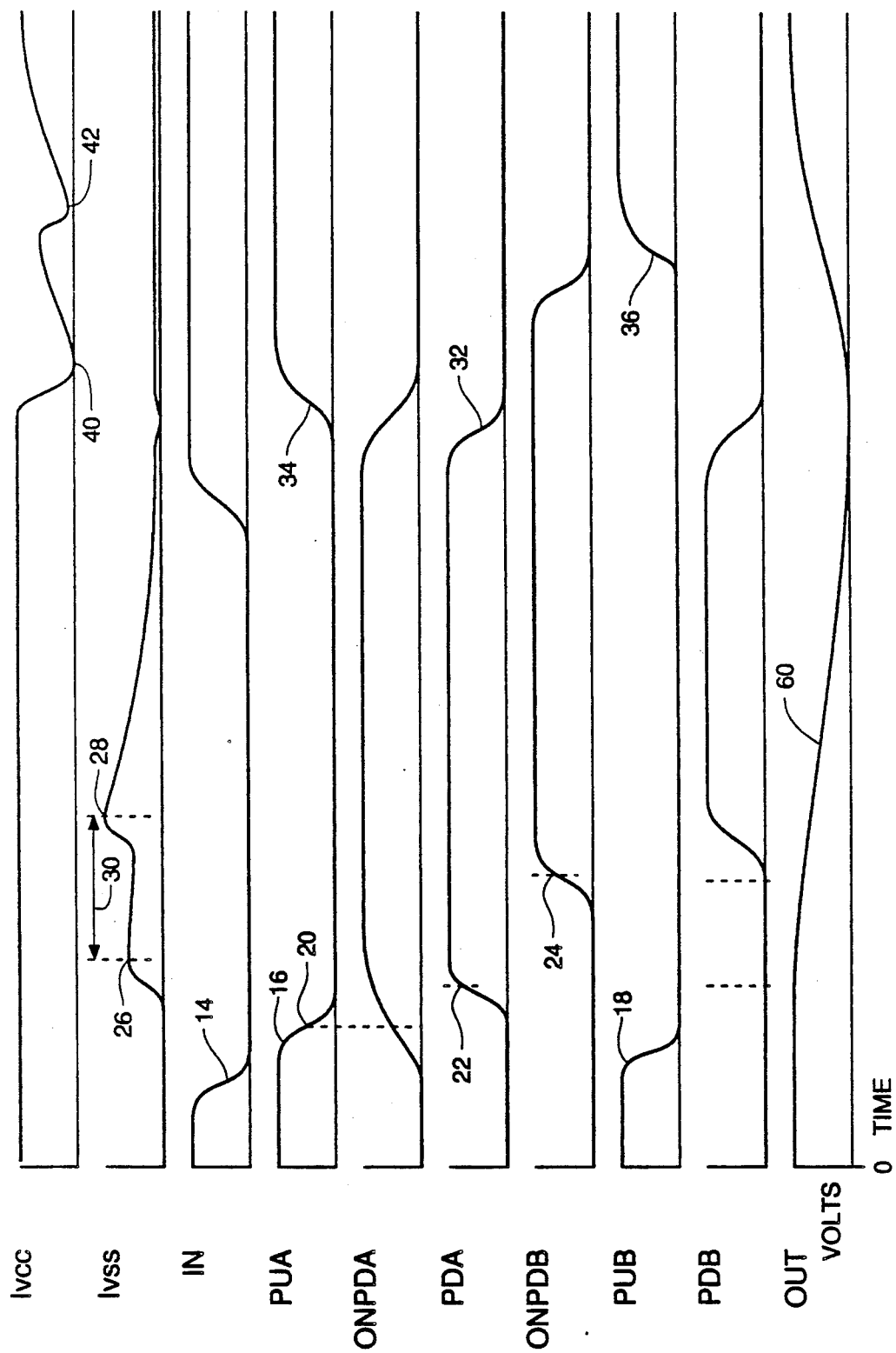
FIG. 3 is a high-speed trace of currents and voltages during switching.

Understanding the operation of the circuit will be aided by referring to FIG. 3, which is a high speed transient recording of a cycle of the present invention sampling ten parameters in the circuit. The top two traces show the current in mA. (It should be noted that due to instrumentation methods the current trace $I_{VCC}$ representing current into $V_{CC}$ terminal is inverted.) The remaining eight traces below record 0 v–5 v. 5 v is a nominal power supply voltage $V_{CC}$ for this integrated circuit.

Referring to FIG. 3, when IN signal goes to a low state as at 14, signals PUA and PUB immediately turn off due to NAND gates UA and UB and inverters IUA and IUB as illustrated at 16 and 18. PDA goes high at 22 when signal PUA is within 1 v of ground as at 20 which turns on M3. Some time later, as set by the delay element DED, ONPDB goes high at 24 which turns on M7. Note in FIG. 3 how the $V_{SS}$ current spikes at 26 as the first stage M3 fires, decays, then spikes again at 28 as the second stage M7 fires. Due to the bias points of M2, M3, M6, and M7, this phenomenon is more noticeable on $V_{CC}$ at 40 and 42 when the output transitions high. The output OUT trace changes slowly from a high to low state during this two-stage action. The delay value 30 shown in FIG. 3 is about 4 ns, and can be adjusted to trade off output transition times and power supply transient noise due to the current spike height. Note also that there is no significant $V_{CC}$ current $I_{VCC}$ that flows to $V_{SS}$ ($I_{VSS}$). This illustrates the elimination of crossing current described earlier. In a similar manner, the M2 and M6 MOS transistors are fired as initiated by inverted signal IN which causes PDA and PDB to go low. As PDA signal drops below 1 v as at 32, the PUA signal goes high turning on M2 at 34, followed by second stage PUB at 36 which activates gate at M6. Again the first and second stage current peaks (inverted) can be seen at 40 and 42 on $I_{VCC}$.

Note that when signal TRI* goes low (not shown), all devices turn off immediately which results in a high impedance output, the third state of the tri-state output.

Figure 4:
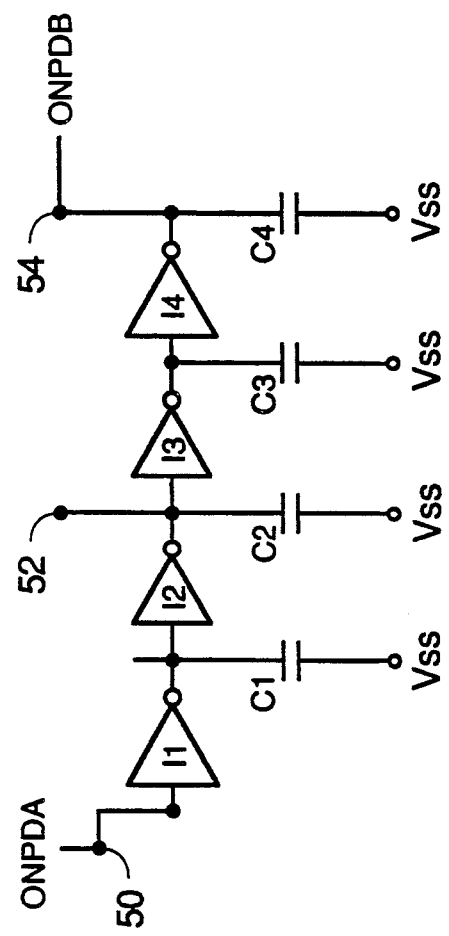
FIG. 4 is a schematic diagram of the delay circuit of the present invention.

FIG. 4 illustrates a typical delay circuit that in this case is shown connected between terminals ONPDA and ONPDB. It comprises a series of inverters I1, I2, I3, and I4 each having an output connection to capacitors C1, C2, C3, and C4 and tap connections at 50, 52, and 54 for connections to ONPDB. The time constant can be increased or decreased by selecting one of the true taps. In this delay circuit the tap 54 would provide the longer time constant or time delay. More or fewer inverters and capacitors (even numbers only) may be used to extend or reduce the time delay range. The preferred delay is about 4 ns, and a delay range of 0 ns to 4 ns is desirable. A delay of 4 ns reduces the current spike to a minimum, but extends the overall response time between IN and OUT signals as indicated by the difference in time of IN point 14 and OUT point 60 (about 12 ns). Extending the delay beyond 4 ns merely reduces second current peak to a lesser value, having no effect on the first peak, hence, no improvement in maximum peak reduction.

During the design and fabrication of the component employing the invention, the timing of various operations, as previously described, must be taken into consideration.

By careful selection of various threshold voltages, and proper sizing to ensure those threshold voltages are met, the crossing current can be adjusted to desired levels.

The selection of the tap connection and gate trip points may be done based on IC device testing. The tap connection and trip point alterations can be made by stopping fabrication of selected wafers prior to the last two photolithographic steps. The next to last mask and metallization step would connect the preferred tap to the second stage NAND gate input ONPDA or ONPDB. The last mask step is a protective coating and would not change between devices.

Although the present invention discloses a circuit having two stages of turn on and turn off, it is possible to add an additional stage(s) using a shorter time delay between each stage. The additional stage, although it may reduce the current spikes, would increase the IC chip fabrication complexity.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims. For example, an inverting buffer circuit is accomplished simply by removing IUA, IUB, IDA, and IDB. Cross-coupling is still provided to M2 and M3, and DEU and DED still provide a delay to the second stage. Further variation is possible, such as using NOR gates in place of NAND gates, for example.

I claim:

1. A low noise output buffer circuit comprising:
   a. a first stage having an input, a pull-up, a pull-down, a delay, and an output, wherein said output is coupled with said pull-up and pull-down;
   b. a second stage having an input, a pull-up, a pull-down, and an output, wherein said second stage input is coupled with said delay, said delay causing delayed firing of said second stage, and wherein said second stage output is coupled with said second stage pull-up and pull-down, and with said first stage output; and
   c. first and second stage control logic comprising:
      1) a pair of first stage NAND gates and a pair of second stage NAND gates, each NAND gate having inputs and an output, and each pair consisting of a pull-up NAND and a pull-down NAND gate;
      2) a pair of first stage logic inverters and a pair of second stage logic inverters, each inverter having an input and an output, said inverter inputs coupled to said NAND gate outputs;
      3) a plurality of CMOS field effect transistors (FETs) coupled to said logic inverter outputs;
      4) power supply connections; and
      5) a pair of delay circuits coupled to said first stage NAND gate outputs wherein an input signal to said first stage NAND gates causes a delayed firing of said second stage NAND gates;
whereby said delayed firing reduces current surge through said power supply connections.

2. The circuit as recited in claim 1, wherein a maximum power supply current peak occurring during switching on or switching off operation is four milliamps.

3. The circuit as recited in claim 1, wherein a parallel third state input signal to all NAND gates turns all NAND gates off immediately, resulting in high impedance output of the circuit.

4. The circuit as recited in claim 1, wherein the plurality of FETs consist of four pairs, a first FET of each pair being activated by a first stage or second stage logic inverter.

5. The circuit as recited in claim 1, wherein the delay circuits comprise:
   a. a plurality of serially coupled inverters;
   b. an electrical tap connection between each inverter; and
   c. a plurality of capacitors each having a first end coupled to each of the tap connections and a second end coupled to a power supply ground,
   wherein the time delay is selectable by coupling a second stage NAND gate input to one of the electrical tap connections.

6. The circuit as recited in claim 4, wherein a pair of pull-up FETs are connected between an output connection and serially through a resistor to a positive power supply connection.

7. The circuit as recited in claim 4, wherein a pair of pull-down FETs are coupled between an output connection and a power supply ground connection.

8. The circuit as recited in claim 5, wherein the time delay is about four nanoseconds.

9. The circuit as recited in claim 5, wherein the variable time delay range is between zero and four nanoseconds.

10. The circuit of claim 1 wherein said first stage NAND gates are cross coupled in a NAND latch configuration.

11. The circuit of claim 1 wherein an input of said first stage pull-up NAND gate is coupled with an input of said first stage pull-down NAND gate through an inverter.

12. A low noise, CMOS, tri-state, output buffer circuit comprising:
   a. two pair of NAND gates having inputs and outputs, each pair consisting of a first stage and second stage so that each stage has a pull-up NAND and a pull-down NAND gate;
   b. two pair of logic inverters, each logic inverter having an input and an output, and each pair consisting of a first stage and a second stage coupled to said NAND gate outputs;
   c. a plurality of CMOS field effect transistors (FETs) coupled to said logic inverter outputs;
   d. power supply connections; and
   e. a pair of delay circuits coupled to said first stage NAND gate outputs wherein an input signal to said first stage NAND gates causes a delayed firing of said second stage NAND gates;
   whereby said delayed firing reduces current surge through said power supply connections.

13. The circuit as recited in claim 12, wherein a maximum power supply current peak occurring during switching on or switching off operation is four milliamps.

14. The circuit as recited in claim 12, wherein a parallel third state input signal to all NAND gates turns all NAND gates off immediately, resulting in high impedance output of the circuit.

15. The circuit as recited in claim 12, wherein the plurality of FETs consist of four pairs, a first FET of each pair being activated by a first stage or second stage logic inverter.

16. The circuit as recited in claim 11, wherein the delay circuits comprise:
   a. a plurality of serially coupled inverters;
   b. an electrical tap connection between each inverter; and
   c. a plurality of capacitors each having a first end coupled to each of the tap connections and a second end coupled to a power supply ground,
   wherein the time delay is selectable by coupling a second stage NAND gate input to one of the electrical tap connections.

17. The circuit as recited in claim 15, wherein a pair of pull-up FETs are connected between an output connection and serially through a resistor to a positive power supply connection.

18. The circuit as recited in claim 15, wherein a pair of pull-down FETs are coupled between an output connection and a power supply ground connection.

19. The circuit as recited in claim 16, wherein the time delay is about four nanoseconds.

20. The circuit as recited in claim 16, wherein the variable time delay range is between zero and four nanoseconds.

21. The circuit of claim 12 wherein said first stage NAND gates are cross coupled in a NAND latch configuration.

22. The circuit of claim 12 wherein an input of said first stage pull-up NAND gate is coupled with an input of said first stage pull-down NAND gate through an inverter.

23. A low noise, CMOS, tri-state, output buffer circuit comprising:
   a. two pair of NAND gates having inputs and outputs, each pair consisting of a first stage and a second stage so that each stage has a pull-up NAND gate and a pull-down NAND gate;
   b. two pair of logic inverters, each logic inverter having an input and an output, and each pair consisting of a first stage and a second stage coupled to said NAND gate outputs;
   c. power supply connections;
   d. four pair of CMOS FETs, each pair coupled between said logic inverters, the power supply connections, and an output terminal; and
   e. a pair of delay circuits, each pair coupled to said first stage NAND gate outputs wherein an input signal to said first stage NAND gates causes a delayed firing of said second stage NAND gates;
   whereby said delayed firing reduces current surge through said power supply connections.

24. The circuit as recited in claim 23, wherein a maximum power supply current peak occurring during switching on or switching off operation is four milliamps.

25. The circuit as recited in claim 23, wherein a third state input signal to all NAND gates turns all NAND gates off immediately, resulting in high impedance output of the circuit.

26. The circuit as recited in claim 23, wherein a pair of pull-up FETs are coupled serially through a resistor to a positive power supply connection.

27. The circuit as recited in claim 23, wherein a pair of pull-down FETs are coupled between an output connection and a power supply ground connection.

28. The circuit as recited in claim 23, wherein the delay circuits comprise:
 a. a plurality of serially coupled inverters;
 b. an electrical tap connection between each inverter; and
 c. a plurality of capacitors each having a first end coupled to each of said tap connections and a second end coupled to a power supply ground,
 wherein the time delay is selectable by coupling a second stage NAND gate input to one of said electrical tap connections.

29. The circuit as recited in claim 28, wherein the time delay is about four nanoseconds.

30. The circuit as recited in claim 28, wherein the variable time delay range is between zero and four nanoseconds.

31. The circuit of claim 23 wherein said first stage NAND gates are cross coupled in a NAND latch configuration.

32. The circuit of claim 23 wherein an input of said first stage pull-up NAND gate is coupled with an input of said first stage pull-down NAND gate through an inverter.

33. A method of low-noise activating and deactivating a CMOS tri-state output buffer circuit comprising:
 a. switching an IN signal from a high to low state;
 b. switching a first and a second stage pull-up NAND gate inverter to a low state;
 c. activating a pull-down delay circuit and de-energizing a first stage pull-down NAND gate;
 d. switching a first stage pull-down NAND gate inverter from a low state to high state;
 e. switching a pair of first stage pull-down FETs from a low to high state, thereby changing an output voltage from a high state to a low state;
 f. energizing a second stage pull-down NAND gate inverter from said pull-down delay circuit after a preselected time delay;
 g. switching an output from said second stage pull-down NAND inverter from a low state to high state;
 h. switching a pair of second stage pull-down FETs from a low state to high state, thereby increasing the output drive current and speed in which the output switches to a low state;
 i. changing said IN signal from the low state to a high state;
 j. an inverter to invert said IN signal; and
 k. repeating the above steps such that said pull-up first stage and second stage NANDs, inverters and FETs perform the same actions thereby slowly restoring the output voltage from a low state to a high state with a minimal switching current peak at a power supply positive terminal.

34. The method as recited in claim 33, wherein the preselected time delay is set at four nanoseconds.

35. The method as recited in claim 33, further including the step of sizing the pull-up and pull-down logic to ensure that outputs of said pull-up NAND gate inverters are within one volt of a predetermined ground potential prior to switching outputs of said pull-down NAND gate inverters to a high state thereby minimizing crossing current.

36. The method as recited in claim 33 wherein said activation of said pull-down delay circuit is accomplished by tripping a threshold voltage of said pull-down NAND gate.

37. The method as recited in claim 36 wherein said threshold voltage is determined by the sizing of a transistor.

* * * * *